US007317253B2

(12) United States Patent
Nogami

(10) Patent No.: US 7,317,253 B2
(45) Date of Patent: Jan. 8, 2008

(54) COBALT TUNGSTEN PHOSPHATE USED TO FILL VOIDS ARISING IN A COPPER METALLIZATION PROCESS

(75) Inventor: Takeshi Nogami, Hopewell Junction, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 347 days.

(21) Appl. No.: 11/113,934

(22) Filed: Apr. 25, 2005

(65) Prior Publication Data
US 2006/0237853 A1 Oct. 26, 2006

(51) Int. Cl.
*H01L 21/28* (2006.01)

(52) U.S. Cl. .................. 257/758; 257/E21.175; 438/625; 438/631; 438/638; 438/675

(58) Field of Classification Search ............... 257/758, 257/E21.175; 438/625, 631, 638, 675
See application file for complete search history.

(56) References Cited

U.S. PATENT DOCUMENTS

| | | | | |
|---|---|---|---|---|
| 5,695,810 | A | | 12/1997 | Dubin et al. .................. 427/96 |
| 5,958,798 | A | * | 9/1999 | Shields ......................... 438/710 |
| 5,981,374 | A | * | 11/1999 | Dalal et al. .................. 438/624 |
| 5,981,377 | A | * | 11/1999 | Koyama ........................ 438/633 |
| 6,046,104 | A | * | 4/2000 | Kepler ........................ 438/637 |
| 6,077,770 | A | * | 6/2000 | Hsu ............................. 438/622 |
| 6,080,660 | A | * | 6/2000 | Wang et al. .................. 438/637 |
| 6,083,825 | A | * | 7/2000 | Lin et al. ..................... 438/629 |
| 6,146,996 | A | * | 11/2000 | Sengupta ..................... 438/639 |
| 6,159,851 | A | * | 12/2000 | Chen et al. .................. 438/669 |
| 6,277,726 | B1 | * | 8/2001 | Kitch et al. .................. 438/618 |
| 6,342,733 | B1 | | 1/2002 | Hu et al. ..................... 257/750 |
| 6,528,411 | B2 | * | 3/2003 | Kakuhara ..................... 438/627 |
| 6,734,559 | B1 | | 5/2004 | Yang et al. .................. 257/751 |
| 6,960,529 | B1 | * | 11/2005 | Nelson et al. ............... 438/696 |
| 7,157,380 | B2 | * | 1/2007 | Dubin et al. ................ 438/723 |
| 2002/0192937 | A1 | | 12/2002 | Ting et al. ................... 438/618 |
| 2003/0119317 | A1 | | 6/2003 | Nogami et al. .............. 438/689 |
| 2003/0129825 | A1 | * | 7/2003 | Yoon ........................... 438/626 |
| 2004/0106273 | A1 | | 6/2004 | Yeh et al. .................... 438/584 |
| 2004/0113277 | A1 | | 6/2004 | Chiras et al. ................ 257/774 |
| 2004/0113279 | A1 | | 6/2004 | Chen et al. .................. 257/774 |

(Continued)

*Primary Examiner*—George Fourson
(74) *Attorney, Agent, or Firm*—Mayer & Williams PC; Stuart H. Mayer, Esq.; Karin L. Williams, Esq.

(57) ABSTRACT

A semiconductor device includes a substrate, at least one layer of functional devices formed on the substrate, a first dielectric layer formed over the functional device layer and a first trench/via located in the first dielectric layer. A copper conductor fills the first trench/via. An electromigration inhibiting barrier layer is selectively located over a surface of the copper conductor and not any other remaining exposed surface. An insulating cap layer overlies the barrier layer and the remaining exposed surface. A second dielectric layer overlies the insulating cap layer. A second trench/via is located in the second dielectric layer and extends through the insulating cap layer and the barrier layer. A micro-trench is located within the first dielectric layer and is associated with the formation of the second trench/via. The micro-trench exposes a portion of the copper conductor. A filler fills the micro-trench. The filler is formed from a material used to form the electromigration inhibiting barrier layer.

22 Claims, 8 Drawing Sheets

U.S. PATENT DOCUMENTS

| | | |
|---|---|---|
| 2004/0132291 A1 | 7/2004 | Lee et al. .................... 438/689 |
| 2004/0159553 A1* | 8/2004 | Nogami et al. ............. 205/123 |
| 2004/0224497 A1 | 11/2004 | Barth ......................... 438/637 |
| 2004/0229453 A1 | 11/2004 | Perng ......................... 438/622 |
| 2005/0001325 A1 | 1/2005 | Andricacos et al. ........ 257/762 |
| 2005/0009340 A1 | 1/2005 | Saijo et al. .................. 438/687 |
| 2005/0014359 A1 | 1/2005 | Segawa et al. ............. 438/622 |
| 2005/0280152 A1* | 12/2005 | Fitzsimmons et al. ...... 257/750 |
| 2006/0088975 A1* | 4/2006 | Ueda .......................... 438/421 |
| 2006/0160349 A1* | 7/2006 | Wong et al. ................ 438/618 |

* cited by examiner

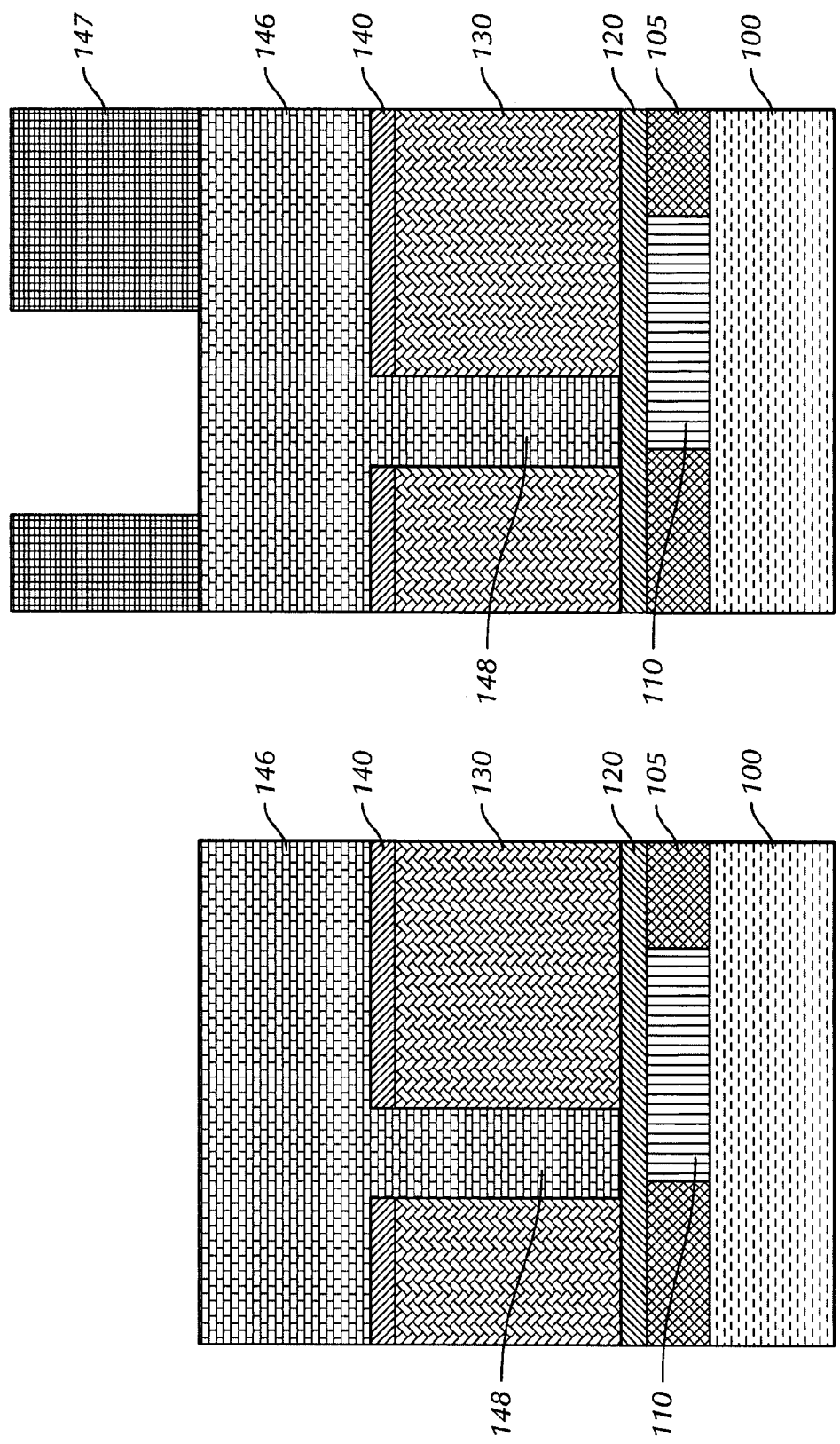

COBALT TUNGSTEN PHOSPHATE USED TO FILL VOIDS ARISING IN A COPPER METALLIZATION PROCESS

FIELD OF THE INVENTION

The present invention relates generally to dual damascene interconnections for integrated circuits, and more specifically to a dual damascene interconnection in which the cap layer can be reduced in thickness when a barrier layer is employed between multilayer metal interconnections.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to provide electrical insulation between metal wires and prevent crosstalk between the metal wiring that can degrade device performance.

A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

One drawback arising from the use of a copper conductor is that copper diffuses rapidly through various materials. To prevent diffusion, various materials are used as barrier materials for copper. To provide barriers between trenches and vias, the preferred barrier materials generally have been silicon nitride or silicon carbide. However, these materials have a high dielectric constant, which mean they tend to increase capacitance and thus reduce semiconductor circuit speed. However, even with the use of a barrier layer, copper is still subject to strong electro-migration, or movement of copper atoms under electrical current which can lead to formation of voids in the copper-filled trenches and vias.

In view of this problem, a barrier material is preferred that prevents copper diffusion, reduces copper electro-migration and has a lower dielectric constant. One such material that has been proposed which largely satisfies these criteria is the metal alloy cobalt tungsten phosphate (CoWP). CoWP also has the advantage that it can be selectively formed only on the copper layers by electroless plating.

Despite the use of CoWP as a barrier material, an additional cap layer is generally also required to serve as a hardmask when a second interconnection (i.e., a trench or via) is etched in an ILD over a first interconnection (i.e., a trench or via). Without the additional cap layer, so-called micro-trenchess may be formed in the ILD as a result of lithographic misalignment. Unfortunately, the cap layer, which is typically silicon nitride or silicon carbide, undesirably increases the dielectric constant of the structure.

Accordingly, it would be desirable to provide a dual damascene interconnect in which the cap layer can be reduced in thickness when a barrier layer is employed between multilayer metal interconnections.

SUMMARY OF THE INVENTION

In accordance with the present invention, a semiconductor device includes a substrate, at least one layer of functional devices formed on the substrate, a first dielectric layer formed over the functional device layer and a first trench/via located in the first dielectric layer. A copper conductor fills the first trench/via. An electromigration inhibiting barrier layer is selectively located over a surface of the copper conductor and not any other remaining exposed surface. An insulating cap layer overlies the barrier layer and the remaining exposed surface. A second dielectric layer overlies the insulating cap layer. A second trench/via is located in the second dielectric layer and extends through the insulating cap layer and the barrier layer. A micro-trench is located within the first dielectric layer and is associated with the formation of the second trench/via. The micro-trench exposes a portion of the copper conductor. A filler fills the micro-trench. The filler is formed from a material used to form the electromigration inhibiting barrier layer.

In accordance with one aspect of the invention, the material forming the filler is a material that allows formation of the barrier layer and the filler by electroless deposition on copper.

In accordance with another aspect of the invention, the material forming the filler is a material that allows formation of the barrier layer and the filler by electroless deposition on copper with activation of a copper surface layer.

In accordance with another aspect of the invention, the material forming the filler is CoWP.

In accordance with another aspect of the invention, the material forming the filler is a cobalt alloy.

In accordance with another aspect of the invention, the material forming the filler is a nickel alloy.

In accordance with another aspect of the invention, the material forming the filler is selected from the group consisting of CoP, CoB, CoW, CoMo, CoWB, CoMoP, CoMoB, NiWP, NiWB, NiMoP, and NiMoB.

In accordance with another aspect of the invention, the insulating cap layer has a thickness less than about 300 angstroms.

In accordance with another aspect of the invention, the insulating cap layer has a thickness between about 50 and 300 angstroms.

In accordance with another aspect of the invention, the first and second dielectric layers are formed from a low-k dielectric material.

In accordance with another aspect of the invention, a liner is located between the copper conductor and sidewalls of the trench/via.

In accordance with another aspect of the invention, a method is provided for forming a semiconductor device. The method begins by forming at least one layer of functional devices on a substrate. A first dielectric layer is formed over the functional device layer. A first trench/via is etched in the first dielectric layer. A copper conductor is deposited to fill the first trench/via. An electromigration inhibiting barrier layer is formed over a surface of the copper conductor and not any other remaining exposed surface. An insulating cap layer overlies the barrier layer and the remaining exposed surface. A second dielectric layer overlies the insulating cap layer. A second trench/via is etched in the second dielectric layer and extends through the insulating cap layer and the barrier layer. The second trench/via etching step includes the step of etching a micro-trench located within the first dielectric layer. The micro-trench exposes a portion of the copper conductor. The micro-trench is filled with a material used to form the electromigration inhibiting barrier layer.

BRIEF DESCRIPTION OF THE DRAWINGS

FIGS. 1-10 show cross-sectional views illustrating the formation of a dual damascene structure.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

In the present invention a barrier layer is formed between multilayer interconnections without the need to subsequently form a thick cap layer that serves as a hardmask when one interconnection is etched in an ILD above a lower interconnection.

Rather, as detailed below, the cap layer may be significantly reduced in thickness and any micro-trenches that arise in the ILD are filled with the same material that forms the barrier layer (e.g., Co WP). A method of fabricating dual damascene interconnections according to an embodiment of the present invention will now be described with reference to FIG. 1 through 5(*b*).

Figure 1:
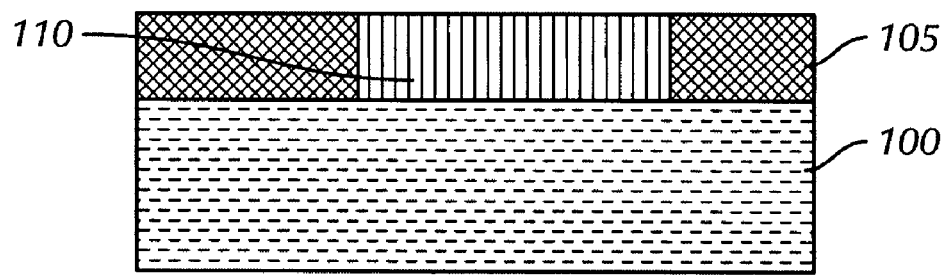

As shown in FIG. 1, a substrate 100 is prepared. A lower ILD 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistivity. Also, the surface of the lower interconnection 110 is preferably planarized.

Figure 2:
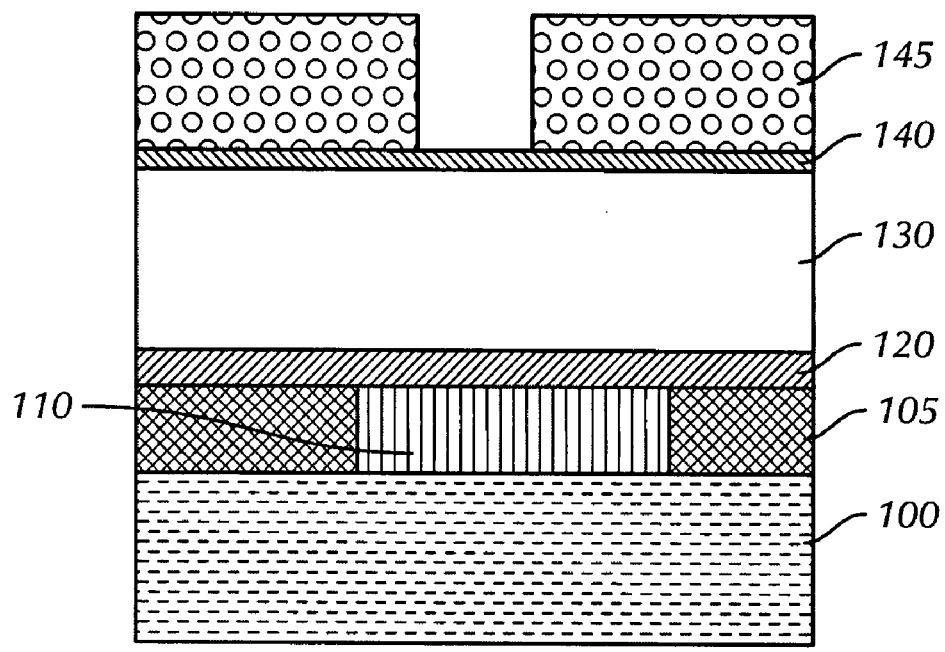

Referring to FIG. 2, a cap layer 120, a low-k ILD 130, and an optional hard mask 140 are sequentially stacked on the surface of the substrate 100 where the lower interconnection 110 is formed, and a photoresist pattern 145 is formed on the hard mask 140 to define a via.

The cap layer 120 is formed to prevent electrical properties of the lower interconnection 110 from being damaged during a subsequent etch process for forming a trench and via. Accordingly, the cap layer 120 is formed of a material having a high etch selectivity with respect to the ILD 130 formed thereon. Preferably, the cap layer 120 is formed of SiC, SiN, or SiCN, having a dielectric constant of 4 to 5. The cap layer 120 is as thin as possible in consideration of the effective dielectric constant of the entire ILD, but thick enough to properly function as an etch stop layer and a diffusion barrier against copper diffusion.

The ILD 130 is formed of a hybrid low-k dielectric material such as SiOCH, which has advantages of organic and inorganic materials. That is, the ILD 130 is formed of a hybrid low-k dielectric material having low-k characteristics, which can be formed using a conventional apparatus and process, and which is thermally stable. The ILD 130 has a dielectric constant of e.g., 3.5 or less, to prevent an RC delay between the lower interconnection 110 and dual damascene interconnections and minimize cross talk and capacitance. For example, the ILD 130 may be formed of low-k organosilicon material such as Black Diamond™, CORAL™, or a similar material. The ILD 130 can be formed using chemical vapor deposition (CVD), and more specifically, plasma-enhanced CVD (PECVD). The ILD 130 may be also formed from low k materials such as spin-on organics and organo silicates. The ILD 130 is formed to a thickness of about 3,000 angstroms to 20,000 angstroms or other appropriate thicknesses determined by those skilled in the art.

If employed, the hard mask 140 prevents the ILD 130 from being damaged when dual damascene interconnections are planarized using chemical mechanical polishing (CMP). Thus, the hard mask 140 may be formed of $SiO_2$, SiOF, SiON, SiC, SiN, or SiCN. The hard mask 140 may also function as an anti-reflection layer (ARL) in a subsequent photolithographic process for forming a via and trench. In this case the hard mask 140 is more preferably formed of $SiO_2$, SiON, SiC, or SiCN.

Figure 3:
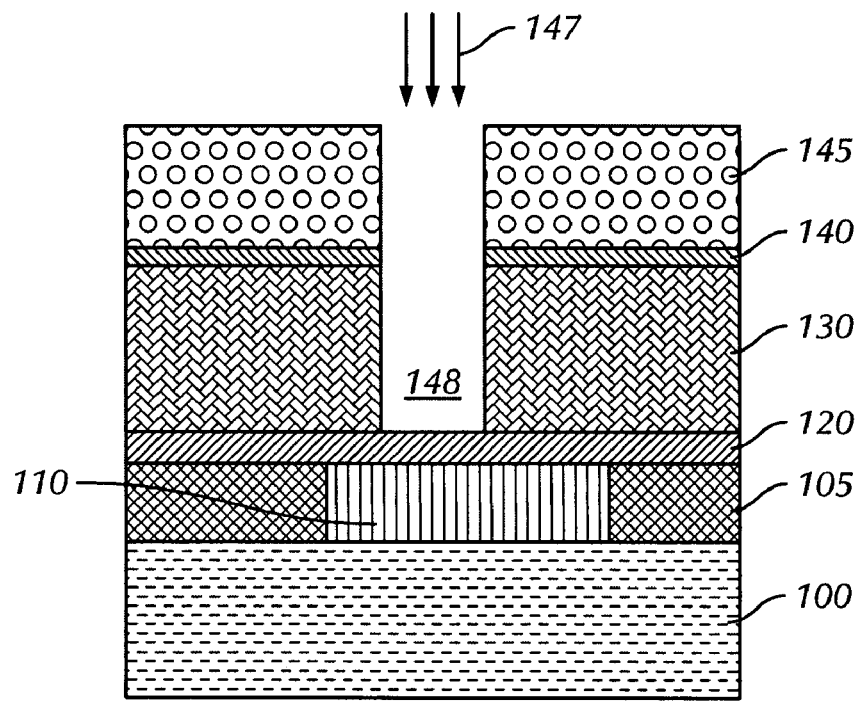

The photoresist pattern 145 is formed by forming a layer of a photoresist and then performing exposure and developing processes using a photo mask defining a via. Referring to FIG. 3, the ILD 130 is anisotropically etched (147) using the photoresist pattern 145 as an etch mask to form a via 148. The ILD 130 can be etched, for example, using a reactive ion beam etch (RIB) process, which uses a mixture of a main etch gas (e.g., $C_xF_y$ and $C_xH_yF_z$), an inert gas (e.g. Ar gas), and possibly at least one of $O_2$, $N_2$, and COX. Here, the RIE conditions are adjusted such that only the ILD 130 is selectively etched and the cap layer 120 is not etched.

Figure 4:
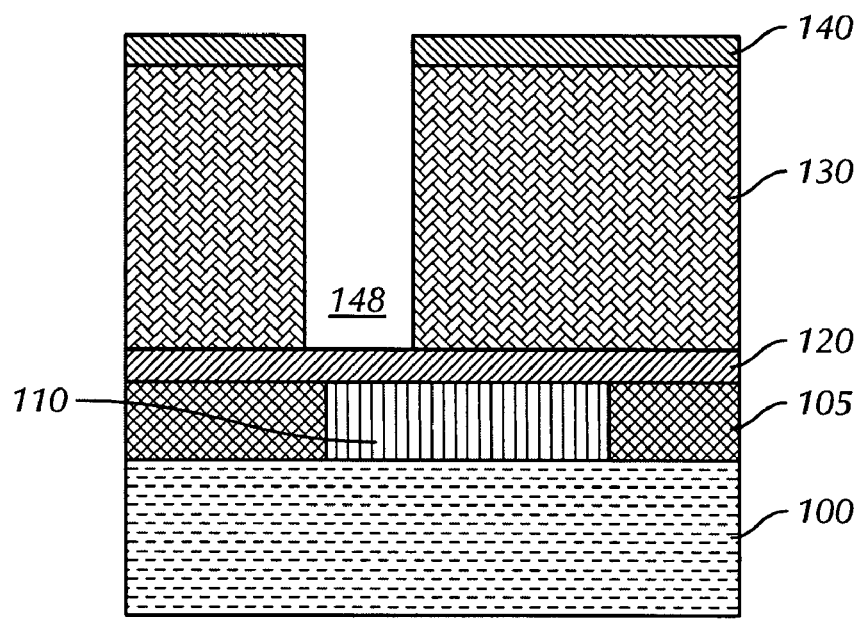
Figure 7:
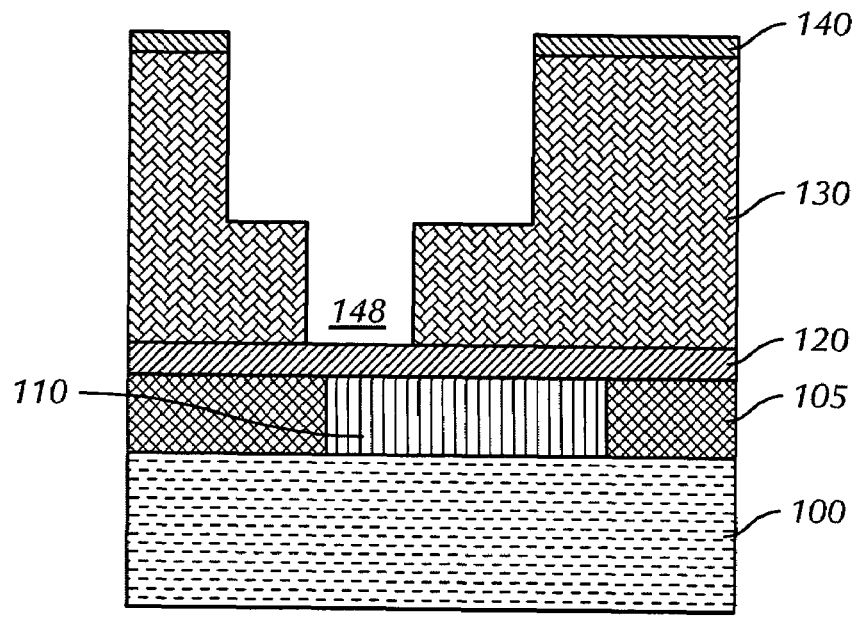
Figure 8:
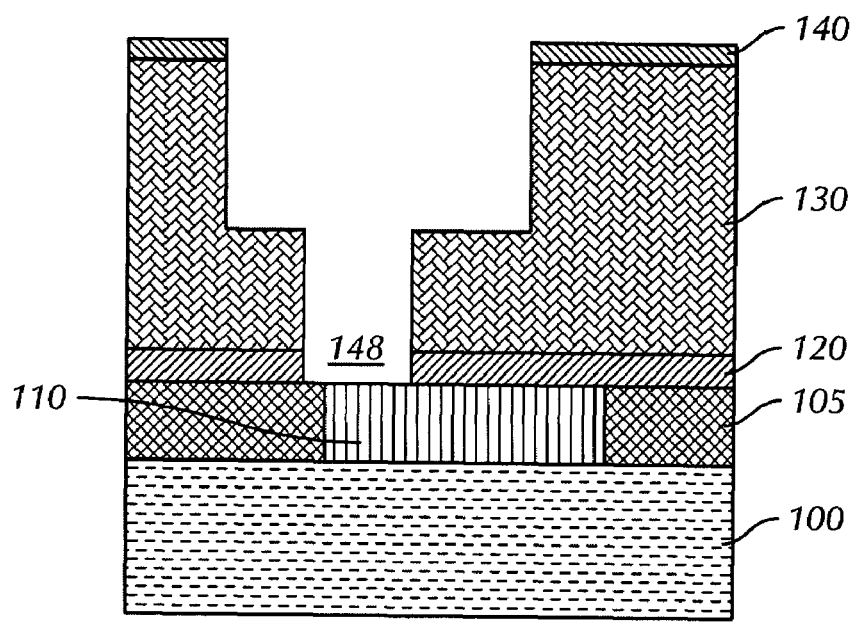

Referring to FIG. 4, the via photoresist pattern 145 is removed using a plasma etch, for example. In FIG. 5, the via formed in the previous step is filled with an organic polymer back filling material 146 that is spin-coated and baked. Over the back filling material 146, the photoresist trench pattern 147 is defined in a lithography process (FIG. 6) The trench pattern is transferred to the ILD layer by dry etching of the filling back material 146, the hard mask 140, and the ILD 130. The etching is stopped halfway during the etching of the ILD 130 as shown in FIG. 7. After the plasma dry etching, the photoresist 147 and the remained filling back material 146 are removed by oxygen plasma, for example (FIG. 7). Then, the cap layer 120 at the bottom of the via is removed by dry etching to expose the copper surface of the lower interconnection 110. This dry etching to remove the etching stop layer is selectively performed where the etching stop layer 110 such as SiC and SiN is etched while the ILD layer in the lower interconnection 105 is not etched. (FIG. 8)

Figure 9:
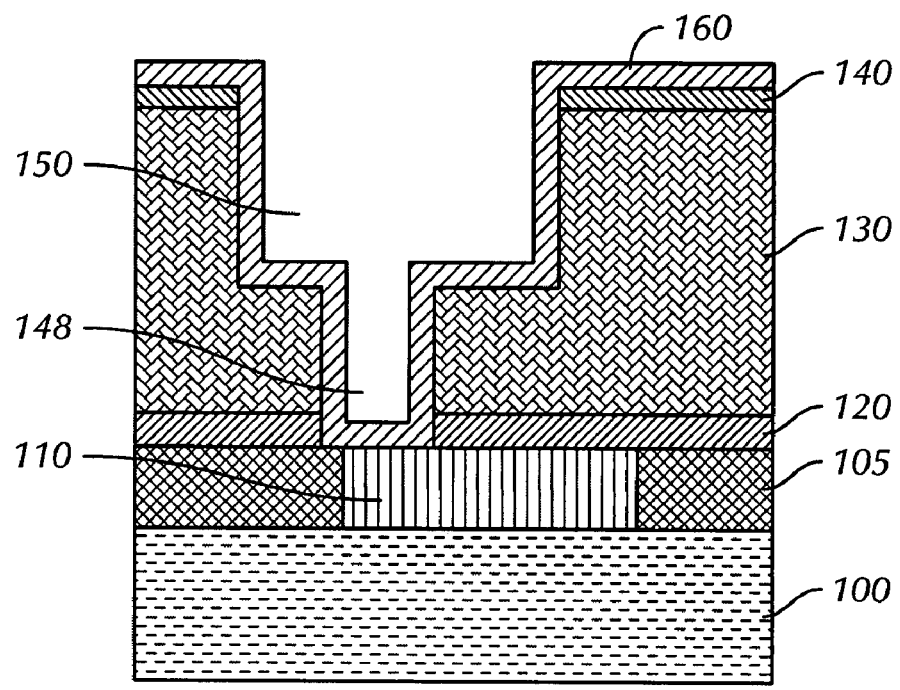
Figure 10:
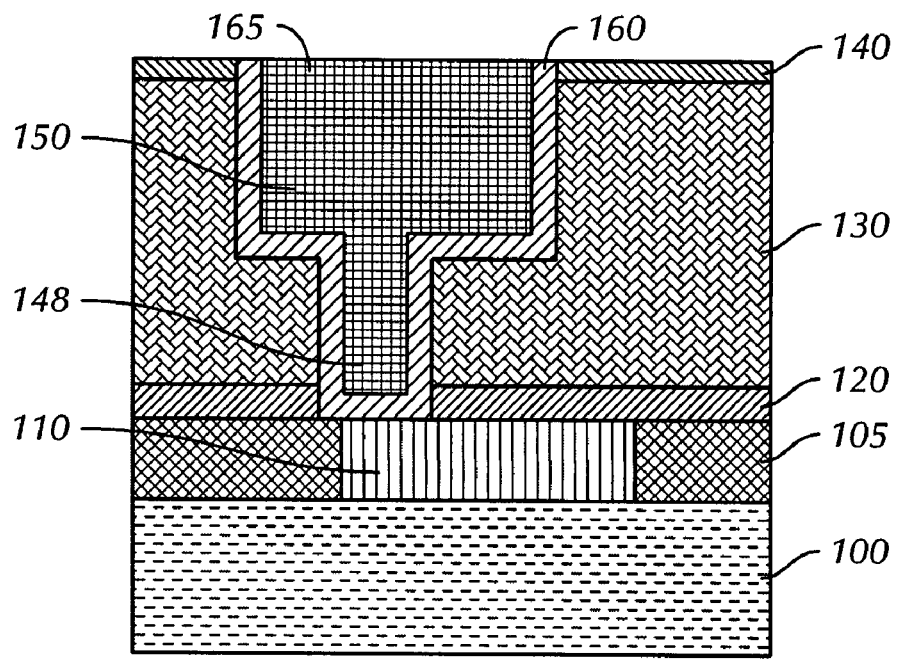

In FIG. 9 a liner 160 is formed on the via 148 and the trench 150 to prevent the subsequently formed copper conductive layer from diffusing into ILD 130. The liner 160 is generally formed from a conventional material such as tantalum, tantalum nitride, titanium, titanium silicide or zirconium. After formation of the liner 160 the copper conductive layer is formed on the liner by an electroplating process. The bulk copper layer 165 is formed by electroplating and then planarized in FIG. 10.

Figure 11:
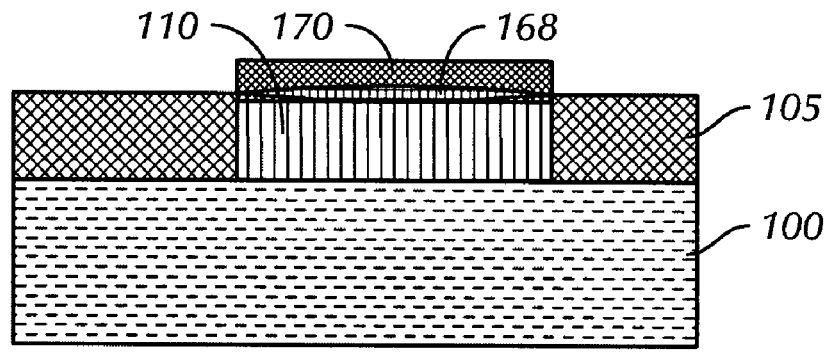
FIGS. 11 and 12 show an alternative process for forming the cap layer shown in FIGS. 1-5(*b*), which uses an additional barrier layer.
Figure 12:
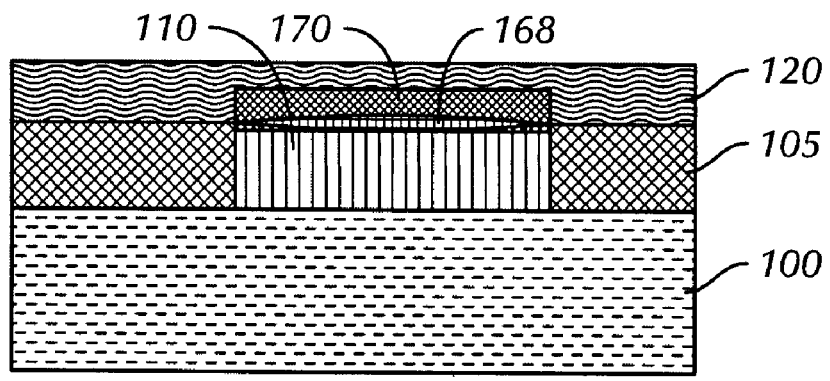

In one alternative approach to the aforementioned process steps, the cap layer 120 formed in FIG. 2 may include a additional barrier layer 170 such as shown in FIGS. 11 and 12. In FIG. 11, the barrier layer is formed by deposition prior to the formation of cap layer 120. The barrier layer 170 comprises an electromigration inhibiting/diffusion barrier metal cap such as CoWP that prevents the copper conductor material 165 from diffusing into the cap material 120. The barrier layer 170 is selectively formed on the copper layer 110 and not on the ILD in the lower interconnection 105 using an electroless deposition process. The barrier layer 170 is electrolessly deposited by either immersing the wafer in a CoWP electroless deposition solution or by spraying the solution onto the wafer. Since copper is not catalytic to the electroless deposition of CoWP, the copper layer requires a catalytic layer 168 such as Pd (palladium).

It is appreciated that a variety of electroless deposition solutions can be adapted for electrolessly depositing CoWP (see for example, "Thick Selective Electroless-Plated Cobalt-Nickel Alloy Contacts to $CoSi_2$;" Georgiou et al.; J. Electrochem. Soc., Vol. 138, No. 7; July 1991; pp. 2061-2069). For instance, as discussed in U.S. Pat. No. 5,695,810, one electroless CoWP deposition solution that may be employed is comprised of Co and W compounds with hypophosphite as a reducing agent. The reference suggests maintaining the solution at a temperature of 70°-95° C. and at a pH of 8-11. The particular CoWP solution that is discussed is comprised of 10 grams/liter of $(NH4)2\ WO4$, 30 g/l of $CoCl_2 6H_2O$, 80 g/l of $Na_3\ C6H_4O_7\ 2H_2O$, 20 g/l of $Na_2H_2\ PO_2$, 0.05 g/l of RHODAFAC#RE610 (manufactured by Rhone-Poulenc) in de-ionized water. The deposition rate of electroless CoWP was stated to be approximately 35 nm/min., with an average surface roughness (Ra) at approximately 4 nm for a 150-200 nm thick film. The resistivity of the electroless CoWP was estimated to be about 28-32 micro-ohms-cm.

Next, in FIG. 12 the cap layer 120 is formed over CoWP layer 170 and the exposed portion of the ILD in the lower interconnection 105. The cap layer 120 can comprise an insulating material including $SiO_2$, boron-doped $SiO_2$, BPSG (Boron Phosphorous Silicate Glass), silicon carbide, nitrogen doped silicon carbide, oxides, $Si_3\ N4$, etc., and generally has a substantially higher dielectric constant than the low-K dielectric 130. As previously mentioned, the provision of the cap layer 120 is undesirable because of its relatively high dielectric constant. However, the provision of the barrier layer 170 allows the cap layer 120 to be made thinner than it otherwise would be since the barrier layer 170 prevents metal diffusion from the bulk copper 10 into the cap layer 120. By reducing migration between the cap 120 and the bulk copper layer 110, the barrier layer 170 enhances the electromigration lifetime (reduces migration of the conductor 110) which also reduces so-called stress-migration.

Figure 13:
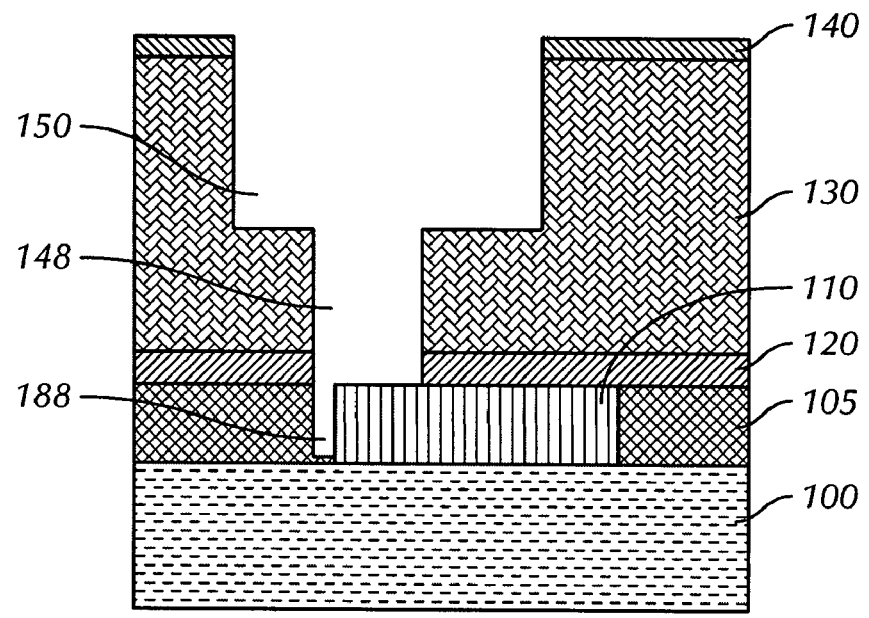
FIGS. 13-16 show the manner in which a micro-trench is formed and subsequently filled during the formation of a via or trench.
Figure 14:
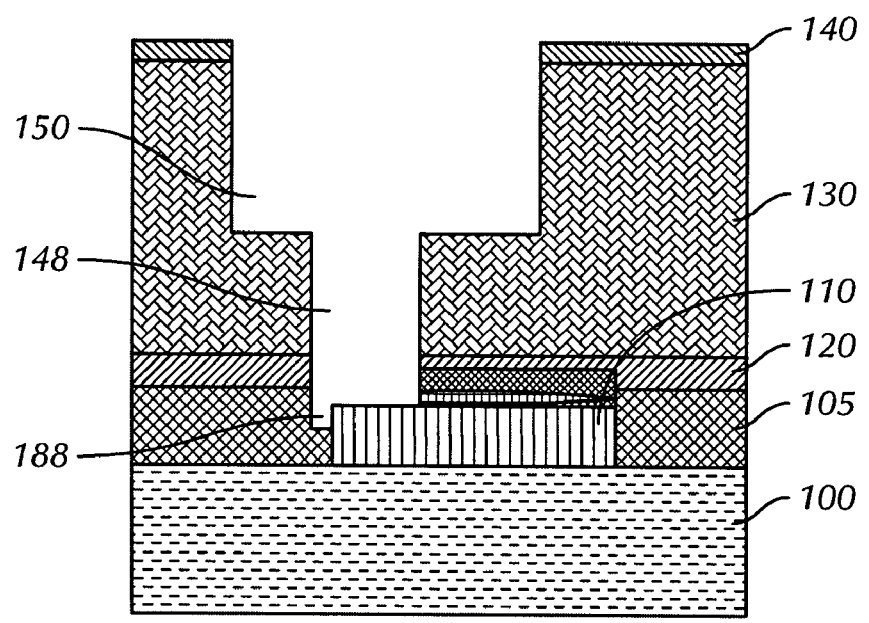

In comparing the two different cap layers 120 formed in FIG. 7 and in FIG. 12, while in FIG. 12 the cap layer 120 may be reduced in thickness because of the provision of barrier layer 170, the cap layer 120 cannot be eliminated entirely, or reduced in thickness beyond a given amount (e.g., 300 angstroms), because of lithographic misalignments that can arise in the formation of the via 148. For instance, instead of forming via 148 in the ideal manner shown in FIG. 8, misalignments may give rise to the micro-trench 188 shown in FIGS. 13 and 14 when ILD 130 is etched if the cap layer 120 is either too thin or not present at all. That is, a micro-trench 188 may be formed adjacent the copper layer 105 if the cap layer 120 is too thin to serve as an etch stop, because once the cap layer 120 is etched through, the ILD 105 is etched at a high etching rate because there is no etching selectivity between ILD 130 and ILD 105. That is, if the cap layer 120 is too thin (or not present), the etching step used to form the via 148 may inadvertently continue through the ILD 105, thereby creating the micro-trench 188. Because the degree of misalignment is likely to be small, the micro-trench 188 will generally be relatively narrow in the lateral direction. Because of its narrowness, the micro-trench 188 can be difficult to fill or otherwise eliminate. Accordingly, despite the use of a barrier layer 170 in the conventional process, the cap layer 120 must still be sufficiently thick to serve as an etch stop. Since the cap layer 120 cannot be made thinner, the overall dielectric constant of the structure cannot be further reduced.

The present inventor has recognized that the cap layer 120 need not serve as an etch stop if the micro-trench 188 that may otherwise form can be filled in a satisfactory manner. In this way the thickness of the cap layer 120 can be reduced from, e.g., 300 angstroms to e.g., 50 angstroms.

Figure 15:
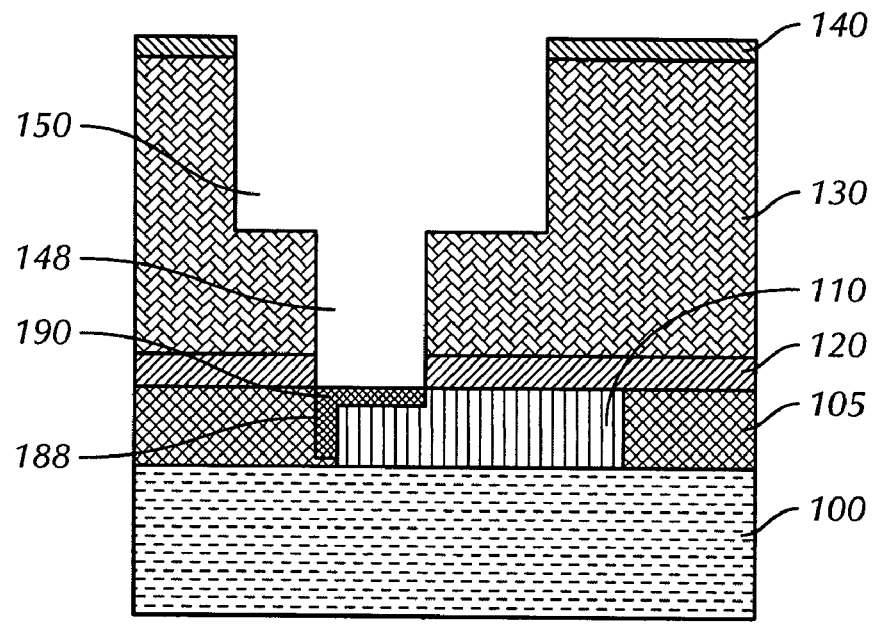
Figure 16:
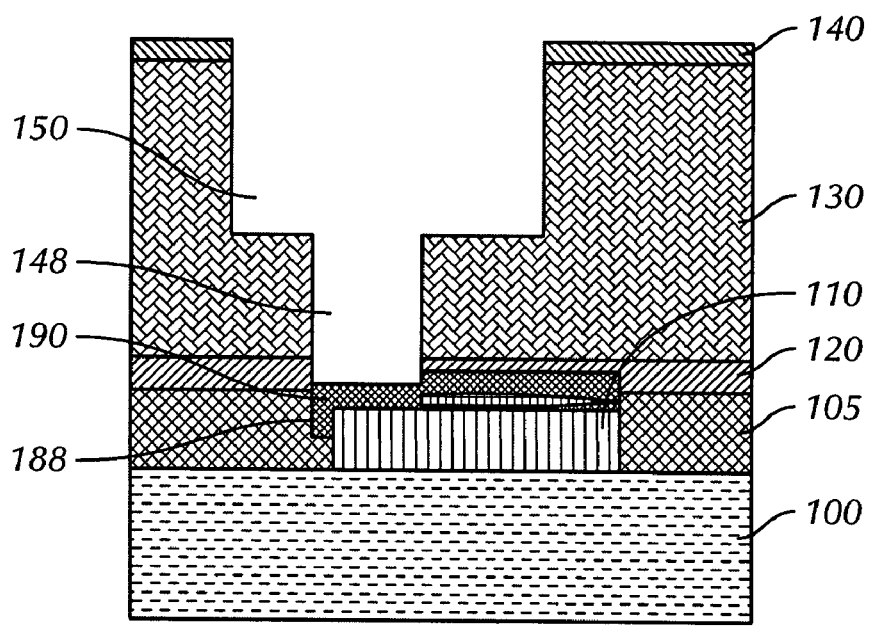

In accordance with the present invention, as shown in FIGS. 15 and 16, micro-trench 188 is filled with a filler material 190 of the type used to form the barrier layer 170. That is the filler material 190 may comprise CoWP. Because an electroless deposition process can be used to form the filler material 190, the micro-trench 188 can be readily filled despite its relatively narrow dimension. Since the filler material 190 is selectively formed on the bulk copper 110, the growth of filler material 190 proceeds upward from the upper surface of bulk copper 110 and laterally outward from the sidewalls of the bulk copper 110. In this way the micro-trench 188 is eliminated using a metallic material that does not unduly increase the overall dielectric constant of the structure. As previously mentioned, since copper is not catalytic to the electroless deposition of CoWP, the bulk copper 1110 need to be activated prior to deposition. After the micro-trench 188 has been filled, the process may continue as described above in connection with FIGS. 9 and 10.

The filler material 190 employed in the present invention is not limited to CoWP. Rather, the filler material 190 may also be formed by an electroless plating process using a cobalt alloy or a nickel alloy. Examples of the cobalt alloy include CoP, CoB, CoW, CoMo, CoWB, CoMoP, and CoMoB. Examples of the nickel alloy include NiWP, NiWB, NiMoP, and NiMoB. Further examples of the usable material include alloys containing both Co and Ni, and alloys containing both W and Mo. An addition of tungsten or molybdenum to cobalt or nickel further prevents the diffusion of copper. Also, phosphorus or boron auxiliarily added in the electroless plating causes the formed film of cobalt or nickel to have a fine crystal structure, thereby contributing to the reduction of copper diffusion. If necessary, the copper surface can be activated by any appropriate means to allow the electroless deposition process to proceed. Moreover, the filler material 190 need not be deposited by an electroless process. More generally, any appropriate conformal deposition technique can be employed that is capable of filling a very thin or narrow micro-trench. In addition to electroless deposition, one example of such a technique is gas phase deposition.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. A semiconductor device, comprising:
   a substrate;
   at least one layer of functional devices formed on the substrate;
   a first dielectric layer formed over the functional device layer;
   a first trench/via located in the first dielectric layer;
   a copper conductor filling the first trench/via;
   an electromigration inhibiting barrier layer selectively located over a surface of the copper conductor and not any other remaining exposed surface;
   an insulating cap layer overlying the barrier layer and the remaining exposed surface;
   a second dielectric layer overlying the insulating cap layer;
   a second trench/via located in the second dielectric layer and extending through the insulating cap layer and the barrier layer;
   a micro-trench located within the first dielectric layer and associated with formation of the second trench/via, said micro-trench exposing a portion of the copper conductor; and
   a filler filling the micro-trench, said filler being formed from a material used to form the electromigration inhibiting barrier layer.

2. The semiconductor device of claim 1 wherein said material forming the filler is a material that allows formation of the barrier layer and the filler by electroless deposition on copper.

3. The semiconductor device of claim 1 wherein said material forming the filler is a material that allows formation of the barrier layer and the filler by electroless deposition on copper with activation of a copper surface layer.

4. The semiconductor device of claim 1 wherein said material forming the filler is CoWP.

5. The semiconductor device of claim 1 wherein said material forming the filler is a cobalt alloy.

6. The semiconductor device of claim 1 wherein said material forming the filler is a nickel alloy.

7. The semiconductor device of claim 1 wherein said material forming the filler is selected from the group consisting of CoP, CoB, CoW, CoMo, CoWB, CoMoP, CoMoB, NiWP, NiWB, NiMoP, and NiMoB.

8. The semiconductor device of claim 1 wherein said insulating cap layer has a thickness less than about 300 angstroms.

9. The semiconductor device of claim 1 wherein said insulating cap layer has a thickness between about 50 and 300 angstroms.

10. The semiconductor device of claim 1 wherein said first and second dielectric layers are formed from a low-k dielectric material.

11. The semiconductor device of claim 1 further comprising a liner located between the copper conductor and sidewalls of the trench/via.

12. A method of forming a semiconductor device, comprising:
   forming at least one layer of functional devices on a substrate;
   forming a first dielectric layer over the functional device layer;
   etching a first trench/via located in the first dielectric layer;
   depositing a copper conductor to fill the first trench/via;
   forming an electromigration inhibiting barrier layer over a surface of the copper conductor and not any other remaining exposed surface;
   forming an insulating cap layer overlying the barrier layer and the remaining exposed surface;
   forming a second dielectric layer overlying the insulating cap layer; etching a second trench/via located in the second dielectric layer that extends through the insulating cap layer and the barrier layer, wherein said second trench/via etching step includes the step of etching a micro-trench located within the first dielectric layer, said micro-trench exposing a portion of the copper conductor; and
   filling the micro-trench with a material used to form the electromigration inhibiting barrier layer.

13. The method of claim 12 wherein said material forming the filler is a material that allows formation of the barrier layer and the filler by electroless deposition on copper.

14. The method of claim 12 wherein said material forming the filler is a material that allows formation of the barrier layer and the filler by electroless deposition on copper with activation of a copper surface layer.

15. The method of claim 12 wherein said material forming the filler is CoWP.

16. The method of claim 12 wherein said material forming the filler is a cobalt alloy.

17. The method of claim 12 wherein said material forming the filler is a nickel alloy.

18. The method of claim 12 wherein said material forming the filler is selected from the group consisting of CoP, CoB, CoW, CoMo, CoWB, CoMoP, CoMoB, NiWP, NiWB, NiMoP, and NiMoB.

19. The method of claim 12 wherein said insulating cap layer has a thickness less than about 300 angstroms.

20. The method of claim 12 wherein said insulating cap layer has a thickness between about 50 and 300 angstroms.

21. The method of claim 12 wherein said first and second dielectric layers are formed from a low-k dielectric material.

22. The method of claim 12 further comprising the step of forming a liner located between the copper conductor and sidewalls of the trench/via.

* * * * *

UNITED STATES PATENT AND TRADEMARK OFFICE
CERTIFICATE OF CORRECTION

PATENT NO. : 7,317,253 B2
APPLICATION NO. : 11/113934
DATED : January 8, 2008
INVENTOR(S) : Takeshi Nogami et al.

It is certified that error appears in the above-identified patent and that said Letters Patent is hereby corrected as shown below:

Col. 3, Line 40, after "invention" insert -- , --.

Col. 3, Line 48, after "e.g.", change "Co WP" to -- CoWP --.

Col. 4, Line 50, before "Here" change "COX" to -- $CO_X$ --.

Col. 4, Line 63, before "filling", change "remained" to -- remaining --.

Col. 5, Line 61, after "copper" change "10" to -- 110 --.

Col. 6, Line 47, after "copper" change "1110" to -- 110 --.

Signed and Sealed this

Seventeenth Day of June, 2008

JON W. DUDAS
*Director of the United States Patent and Trademark Office*